(12) United States Patent
Lee et al.

(10) Patent No.: US 9,318,543 B2
(45) Date of Patent: Apr. 19, 2016

(54) ORGANIC LIGHT-EMITTING DIODE (OLED) DISPLAY AND METHOD OF MANUFACTURING THE SAME

(71) Applicant: Samsung Display Co., Ltd., Yongin, Gyeonggi-Do (KR)

(72) Inventors: A-Rong Lee, Yongin (KR); Young-Il Kim, Yongin (KR); Eui-Gyu Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/462,228

(22) Filed: Aug. 18, 2014

(65) Prior Publication Data

US 2015/0137090 A1    May 21, 2015

(30) Foreign Application Priority Data

Nov. 20, 2013   (KR) .................. 10-2013-0141477

(51) Int. Cl.
*H01L 29/08* (2006.01)
*H01L 27/32* (2006.01)
*H01L 51/52* (2006.01)

(52) U.S. Cl.
CPC .......... *H01L 27/326* (2013.01); *H01L 27/3246* (2013.01); *H01L 27/3258* (2013.01); *H01L 51/5262* (2013.01)

(58) Field of Classification Search
CPC ............ H01L 27/3244; H01L 27/3246; H01L 27/3258; H01L 51/5262; H01L 51/5206; H01L 51/5228; H01L 51/5271
USPC .......................................................... 257/40
See application file for complete search history.

(56) References Cited

U.S. PATENT DOCUMENTS

| 2008/0116791 | A1  | 5/2008 | Kim |
| 2008/0122347 | A1  | 5/2008 | Lee |
| 2011/0007012 | A1* | 1/2011 | Shih .............................. 345/173 |
| 2012/0012848 | A1* | 1/2012 | Suh ..................... H01L 51/0013 257/59 |
| 2013/0057143 | A1* | 3/2013 | Sugimoto et al. ............. 313/512 |

FOREIGN PATENT DOCUMENTS

| KR | 10-2005-0000131 A | 1/2005 |
| KR | 10-0635062 B1 | 10/2006 |
| KR | 10-2007-0038789 A | 4/2007 |
| KR | 10-2008-0047725 A | 5/2008 |
| KR | 10-2013-0015142 A | 2/2013 |

* cited by examiner

*Primary Examiner* — Shaun Campbell

(74) *Attorney, Agent, or Firm* — Knobbe, Martens, Olson & Bear, LLP

(57) ABSTRACT

An organic light-emitting diode (OLED) display and method of manufacturing the same are disclosed. In one aspect, the OLED display includes a substrate, a thin film transistor (TFT) formed over the substrate, and a first pixel defining layer formed over the TFT and having an opening. The OLED display also includes an insulating layer formed in the opening and including a top surface having a dome shape and an OLED formed over the insulating layer.

14 Claims, 4 Drawing Sheets

ORGANIC LIGHT-EMITTING DIODE (OLED) DISPLAY AND METHOD OF MANUFACTURING THE SAME

CROSS-REFERENCE TO RELATED APPLICATIONS

This application claims the benefit of Korean Patent Application No. 10-2013-0141477, filed on Nov. 20, 2013, in the Korean Intellectual Property Office, the disclosure of which is incorporated herein in its entirety by reference.

BACKGROUND

1. Field

The described technology generally relates to an organic light-emitting diode (OLED) display and a method of manufacturing the same.

2. Description of the Related Technology

OLED displays have favorable characteristics such as wide viewing angles, excellent contrast, and fast respond speeds. These characteristics make OLED displays a candidate as a next generation display.

OLED displays include thin film transistors (TFTs) and OLEDs formed on a substrate. The TFTs supply a driving current to the OLEDs in order to emit light. Such OLED displays are used as display units for small and mobile devices such as mobile phones and are also used as display units for larger devices such as televisions.

SUMMARY OF CERTAIN INVENTIVE ASPECTS

One inventive aspect is an OLED display which can reduce chromatic aberration and brightness aberration generated at different viewing angles and a method of manufacturing the display.

Another aspect is an OLED display including a substrate, a TFT disposed above the substrate, a first pixel defining layer disposed above the TFT and having an opening, an insulating layer disposed in the opening of the first pixel defining layer and having a top surface whose curvature radius is uniform, and an OLED disposed above the insulating layer.

The insulating layer may have a shape corresponding to a cylindrical dome.

The substrate may have a major axis and a minor axis perpendicularly intersecting each other and the insulating layer may have a shape corresponding to a part of a cylinder extended along the minor axis.

The insulating layer may have a shape corresponding to a spherical dome.

The OLED may include a pixel electrode disposed above the insulating layer and electrically connected to the TFT, an intermediate layer disposed on the pixel electrode and including an emission layer, and an opposite electrode disposed facing the pixel electrode. A distance from a curvature center of the top surface of the insulating layer to a top surface of the opposite electrode may be uniform.

The OLED may include a pixel electrode disposed above the insulating layer and electrically connected to the TFT, an intermediate layer disposed on the pixel electrode and including an emission layer, and an opposite electrode disposed facing the pixel electrode. The OLED may further include a second pixel defining layer disposed above the first pixel defining layer to cover an edge of the pixel electrode.

Another aspect is a method of manufacturing an OLED display including preparing a substrate, forming a TFT above the substrate, forming a first pixel defining layer above the TFT to have an opening, forming an insulating layer in the opening of the first pixel defining layer, the insulating layer having a top surface whose curvature radius is uniform, and forming an OLED above the insulating layer.

The forming of the insulating layer may include applying a material for forming the insulating layer by using a solution process and drying the material for forming the insulating layer to form a shape corresponding to a part of a cylinder.

The forming of the insulating layer may include applying a material for forming the insulating layer by using a solution process and drying the material for forming the insulating layer to form a shape corresponding to a part of a sphere.

The drying of the insulating layer may include using a dryer whose exhaust rate is higher in a central portion of the insulating layer than an edge of the insulating layer.

The forming of the insulating layer may include performing a surface treatment in such a way that one of a hydrophilic property and a hydrophobic property is different in a central portion and an edge of a layer located underneath the insulating layer exposed by the opening of the pixel defining layer, applying a material for the insulating layer using a solution process, and drying the material for the insulating layer.

The performing of the surface treatment may include performing the surface treatment to allow the central portion to have the hydrophilic property.

The performing of the surface treatment may include performing the surface treatment to allow the edge to have the hydrophobic property.

A distance from a curvature center of the top surface of the insulating layer to a top surface of the opposite electrode may be uniform.

Another aspect is an OLED display including a substrate, a TFT formed over the substrate, a first pixel defining layer formed over the TFT and having an opening, an insulating layer formed in the opening and including a top surface having a dome shape, and an OLED formed over the insulating layer.

The insulating layer has a substantially cylindrical shape. The OLED display has a length extending in a first direction and a height extending in a second direction crossing the first direction and wherein the cylindrical shape of the insulating layer extends along the second direction.

The insulating layer has a substantially spherical shape. The OLED includes a pixel electrode formed over the insulating layer and electrically connected to the TFT, an intermediate layer formed over the pixel electrode and including an emission layer, an opposite electrode formed over the intermediate layer, wherein the top surface of the insulating layer has a center of curvature, and wherein the distances from any point on the top surface of the insulating layer to the center of curvature are substantially the same. The pixel electrode includes an end formed over the first pixel defining layer and the OLED display further includes a second pixel defining layer formed over the first pixel defining layer to cover the end of the pixel electrode.

Another aspect is a method of manufacturing an OLED display, the method including providing a substrate, forming a TFT over the substrate, forming a first pixel defining layer over the TFT, forming an opening in the first pixel defining layer, forming a first insulating layer in the opening, wherein the first insulating layer includes a top surface having a dome shape, and forming an OLED over the first insulating layer.

The forming of the first insulating layer includes applying an insulating material in the opening and drying the insulating material so as to form the first insulating layer having a substantially cylindrical shape. The drying includes using a dryer with a higher exhaust rate at a central portion of the first insulating layer than at an edge of the first insulating layer. The forming of the first insulating layer includes applying an insulating material in the opening and drying the insulating material so as to form the first insulating layer having a substantially spherical shape.

The drying of the insulating material includes using a dryer with a higher exhaust rate at a central portion of the first insulating layer than at an edge of the first insulating layer. The method further includes forming a second insulating layer between the pixel defining layer and the TFT, wherein the forming of the first insulating layer includes performing a surface treatment on the second insulating layer exposed by the opening in the pixel defining layer such that a selected one of a hydrophilic and hydrophobic property of the second insulating layer is different at a central portion of the opening that at an edge of the opening, applying an insulating material in the opening, and drying the insulating material to form the first insulating layer.

The hydrophilic or hydrophobic property of the second insulating layer is different at the central portion of the opening that at the edge of the opening. The forming of the OLED includes forming a pixel electrode over the first insulating layer so as to be electrically connected to the TFT, forming an intermediate layer comprising an emission layer over the pixel electrode, and forming an opposite electrode over the intermediate layer, wherein the top surface of the first insulating layer has a center of curvature, and wherein the distances from any point on the top surface of the insulating layer to the center of curvature are substantially the same.

Another aspect is an OLED display including a substrate, a plurality of pixels formed over the substrate, wherein each pixel includes a TFT, a pixel defining layer formed over the TFT, wherein an opening is defined in the pixel defining layer, an insulating layer formed in the opening and including a top surface, wherein the top surface has a dome shape having a substantially uniform radius of curvature, and an OLED formed over the insulating layer and electrically connected to the TFT.

Sides of the insulating layer contact sides of the opening and wherein the height of the sides of the insulating layer is less than that of the sides of the opening. The dome shape of the top surface of the insulating layer has a center of curvature and wherein the OLED has a center of curvature that is substantially the same as that of the insulating layer. The insulating layer has a substantially cylindrical or spherical shape. The insulating layer has first and second thicknesses, wherein the first thickness is greater than the thickness of the pixel defining layer, and wherein the second thickness is less than the thickness of the pixel defining layer. The first thickness is the maximum thickness of the insulating layer and the second thickness is the minimum thickness of the insulating layer.

DETAILED DESCRIPTION OF CERTAIN INVENTIVE EMBODIMENTS

Figure 1:
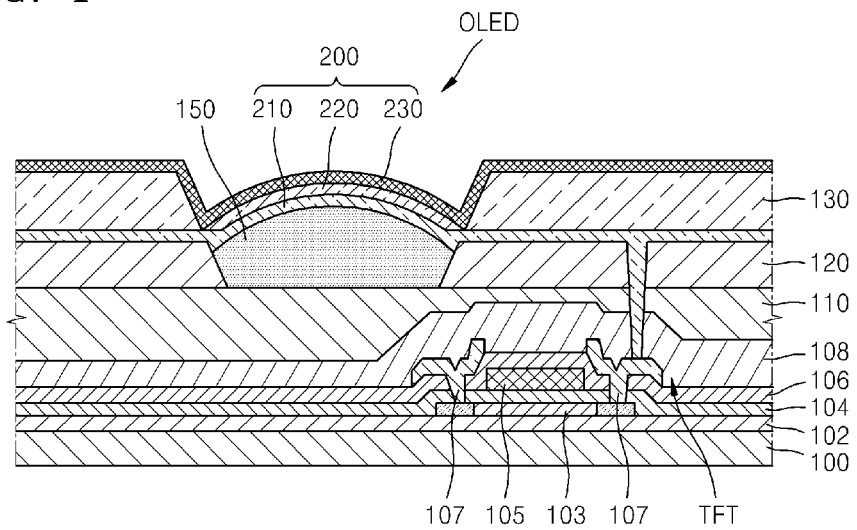
FIG. 1 is a schematic cross-sectional view illustrating an OLED display according to an embodiment.

The standard organic light-emitting diode (OLED) display and methods of manufacturing the same have a limitation wherein color deviations occur in displayed images (particularly on relatively large OLED displays) when not viewed from a typical angle, i.e. perpendicularly from the plane of the display.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the described technology.

Hereinafter, embodiments of the described technology will be described in detail with reference to the attached drawings. However, since the described technology is not limited to the embodiments disclosed below but may be embodied as various different forms, the embodiments below are provided to fully disclose the described technology and to fully convey the scope of the described technology to a person with ordinary skill Also, for convenience of description, in the drawings, the sizes of elements may be exaggerated or contracted. For example, since the sizes and thicknesses of components in the drawings may be exaggerated for convenience of explanation, the following embodiments are not limited thereto.

In the following embodiments, the x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

On the other hand, it will be understood that when a layer, region, or component is referred to as being "formed on" another layer, region, or component, it can be directly or indirectly formed on the other layer, region, or component. That is, for example, intervening layers, regions, or components may also be present.

FIG. 1 is a schematic cross-sectional view illustrating an OLED display according to an embodiment.

Referring to FIG. 1, the OLED display includes a substrate 100, a thin film transistor (TFT), a first pixel defining layer 120, an insulating layer 150, and an OLED 200. The insulating layer 150 is referred to as a third insulating layer 150 to distinguish the third insulating layer 150 from other insulating layers.

The substrate 100 may be formed of a transparent substrate such as a plastic substrate including polyethylene terephthalate (PET), polyethylene naphthalate (PEN), polyimide, etc., or a glass substrate. The substrate 100 is not limited to a transparent substrate for bottom emission of the OLED display. Accordingly, the substrate 100 may be formed of a metallic material if necessary.

The TFT is formed above the substrate 100. The TFT includes a semiconductor layer 103 including amorphous silicon, polycrystalline silicon, or an organic semiconductor material, a gate electrode 105, and source and drain electrodes 107. Hereinafter, the general configuration of the TFT will be described in detail.

In order to planarize a surface of the substrate 100 and/or to prevent impurities from penetrating into the semiconductor layer 103, a buffer layer 102 formed of silicon oxides or silicon nitrides is formed on the substrate 100 and the semiconductor layer 103 is formed on the buffer layer 102.

The gate electrode 105 is formed above the semiconductor layer 103. The source and drain electrodes 107 are electrically connected when a signal is applied to the gate electrode 105. In consideration of adhesion to adjacent layers, surface evenness of deposited layers, and ease of processability, the gate electrode can be formed of a single or multiple layers by using one or more materials such as aluminum (Al), platinum (Pt), palladium (Pd), silver (Ag), magnesium (Mg), gold (Au), Nickel (Ni), neodymium (Nd), iridium (I), chrome (Cr), lithium (Li), calcium (Ca), molybdenum (Mo), titanium (Ti), tungsten (W), and copper (Cu).

In order to provide electrical insulation between the semiconductor layer 103 and the gate electrode 105, a gate insulating layer 104 formed of silicon oxides and/or silicon nitrides is interposed between the semiconductor layer 103 and the gate electrode 105.

An interlayer insulating layer 106 is formed on the gate electrode 105 and may be formed as a single layer or as multiple layers formed of silicon oxides or silicon nitrides.

The source and drain electrodes 107 are formed above the interlayer insulating layer 106. The source and drain electrodes 107 are electrically connected to the semiconductor layer 103 via contact holes formed in the interlayer insulating layer 106 and the gate insulating layer 104. In consideration of the conductivity, etc., of the source and drain electrodes 107, the source and drain electrodes can be formed of a single or multiple layers by using one or more materials such as Al, Pt, Pd, Ag, Mg, Au, Ni, Nd, Ir, Cr, Li, Ca, Mo, Ti, W, and Cu.

In order to protect the TFT having the above described configuration, a first insulating layer 108 covering the TFT is formed as a protection layer. The first insulating layer 108 may be formed of an inorganic material such as silicon oxides, silicon nitrides, and silicon oxynitrides. The first insulating layer 108 is shown in FIG. 1 as a single layer but may be variously modified such as to have a multiple layer structure.

A second insulating layer 110 is formed above the substrate 100. The second insulating layer 110 may be a planarization layer or another protection layer. For example, as shown in FIG. 1, when the OLED is formed above the TFT, the second insulating layer 110 is formed as a planarization layer for planarizing the top surface of the first insulating layer 108 covering the TFT. The first and second insulating layers 108 and 110 may be formed of, for example, an acrylic organic material and benzocyclobutene (BCB). As shown in FIG. 1, the gate insulating layer 104, the interlayer insulating layer 106, the first insulating layer 108, and the second insulating layer 110 are formed above the entire surface of the substrate 100.

Referring to FIG. 1, the first pixel defining layer 120 is formed above the TFT. The first pixel defining layer 120 is formed above the second insulating layer 110 and has an opening. The opening in the first pixel defining layer 120 defines a region, in which a third insulating layer 150 that will be described below is formed.

As described above, the first pixel defining layer 120 has the opening in which the third insulating layer 150 is formed. In some embodiments, the third insulating layer 150 has a curved shape with a top surface having a predetermined radius of curvature. The radius of curvature of the top surface is predetermined, and in some embodiments, the cross section of the third insulating layer 150 on an x-z plane has a substantially semi-circular shape. According to some embodiments, the third insulating layer 150 has a dome shape. The third insulating layer 150 may be formed of, for example, an acrylic organic material and BCB.

As shown in FIG. 1, the third insulating layer 150 is formed in the opening defined in the first pixel defining layer 120 and covers a part of the inside of the opening formed in the first pixel defining layer 120. When the cross section of the third insulating layer 150 on the x-z plane has a substantially semi-circular shape, the third insulating layer 150 is formed on the second insulating layer 110 and does not cover a portion of the inside of the opening defined in the first pixel defining layer 120.

The OLED 200 is formed above the third insulating layer 150. The OLED 200 includes a pixel electrode 210, an intermediate layer 220 including an emission layer, and an opposite electrode 230.

As shown in FIG. 1, the pixel electrode 210 may be disposed above the first pixel defining layer 120 to cover the third insulating layer 150. In this case, an opening exposing at least one of the source and drain electrodes 107 of the TFT is present in the first pixel defining layer 120, the second insulating layer 110, and the first insulating layer 108. Through the opening, the pixel electrode 210 may be in contact with any one of the source and drain electrodes 107 of the TFT to be electrically connected to the TFT.

On the other hand, in FIG. 1, the opening for connecting the pixel electrode 210 to one of the source or drain electrodes 107 of the TFT penetrates through the first pixel defining layer 120, the second insulting layer 110, and the first insulating layer 108. In contrast to the embodiment of FIG. 1, the opening connected to the pixel electrode 210 and one of the source or drain electrodes 107 of the TFT may penetrate through the third insulating layer 150 formed in the opening defined in the first pixel defining layer 120.

That is, the opening connected to the pixel electrode 210 and one of the source or drain electrodes 107 of the TFT may penetrate through the third insulating layer 150, the second insulating layer 110, and the first insulating layer 108. As described above, the third insulating layer 150 has a cross section having a substantially semi-circular shape. When the opening is formed in the third insulating layer 150 as described above, the opening can modify the substantially semi-circular shape of the third insulating layer 150. Accordingly, in the FIG. 1 embodiment, the opening electrically connected to the pixel electrode 210 and one of the source or drain electrodes 107 of the TFT is formed penetrating through the first pixel defining layer 120 and not the third insulating layer 150.

The pixel electrode 210 may be formed as a semitransparent electrode and a reflective electrode. When the pixel electrode 120 is a semitransparent electrode, the pixel electrode 210 may be formed of at least one of ITO, IZO, ZnO, $In_2O_3$, IGO, and AZO. When the pixel electrode 210 is a reflective electrode, the pixel electrode 210 may have a reflective layer formed of at least one of Ag, Mg, Al, Pt, Pd, Au, Ni, Nd, Ir, Cr, and a compound thereof and a layer formed of at least one of ITO, IZO, ZnO, $In_2O_3$, IGO, and AZO. However, the pixel electrode 210 is not limited thereto and may be formed of various materials and may have a structure variously modifiable such as a single layer or a multilayer.

A second pixel defining layer 130 is formed on the pixel electrode 210 and above the first pixel defining layer 120. In some embodiments, the second pixel defining layer 130 covers an edge of the pixel electrode 210. In FIG. 1, it is shown that the pixel electrode 210 is formed over substantially the entire first pixel defining layer 120. However, in other embodiments, the pixel electrode 210 covers the third insulating layer 150 and extends to cover a portion of the first pixel defining layer 120. Accordingly, the second pixel defining layer 130 formed above the first pixel defining layer 120 covers a portion of the edge of the pixel electrode 210.

The second pixel defining layer 130 formed above the first pixel defining layer 120 defines a pixel by having openings corresponding to respective subpixels. That is, the second pixel defining layer 130 has openings covering the edges and exposing a center portion of the pixel electrodes 210. Also, the second pixel defining layer 130 separates an end of the pixel electrode 210 from the opposite electrode 230 above the pixel electrode 210 by a distance, thereby preventing arcs from occurring at the end of the pixel electrode 210. As described above, the first pixel defining layer 120 and the second pixel defining layer 130 may be formed of, for example, an organic material such as polyimide.

The intermediate layer 220 including the emission layer is formed in a pixel region defined by the opening in the second pixel defining layer 130. The intermediate layer 220 of the OLED 200 may include a low-molecular substance or a high-molecular substance.

When including the low-molecular substance, the intermediate layer 220 of the OLED 200 may be formed as a single or complex structure formed by depositing a hole injection layer (HIL), a hole transport layer (HTL), an emission layer (EML), an electron transport layer (ETL), an electron injection layer (EIL) and other layers. Various organic materials such as copper phthalocyanine (CuPc), N, N-Di(naphthalene-1-yl)-N, N'-diphenyl-benzidine (NPB), tris-8-hydroxyquinoline aluminum ($Alq_3$) and other organic materials may be used.

When including the high-molecular substance, the intermediate layer 220 may generally have a structure including an HTL and an EML. In these embodiments, poly(3,4-ethylene-dioxythiophene) (PEDOT) is used as the HTL and high molecular materials such as poly-phenylenevinylene (PPV) and polyfluorene may be used as the EML. However, the intermediate layer 220 is not limited thereto but may have various structures.

The opposite electrode 230 is formed to cover the intermediate layer 220 including the EML, is opposite to the pixel electrode 210, and is formed above the entire surface of the substrate 100. The opposite electrode 230 may be formed as one of a semitransparent electrode and a reflective electrode.

When formed as a semitransparent electrode, the opposite electrode 230 may have a layer formed of a metal having a low work function, such as Li, Ca, LiF/Ca, KiF/Al, Ag, Mg, and a compound thereof and a semitransparent conductive layer formed of at least one of ITO, IZO, ZnO, $In_2O_3$, etc. When formed as a reflective electrode, the opposite electrode 230 may have a layer formed of at least one of Li, Ca, LiF/Ca, LiF/Al, Al, Ag, Mg, and a compound thereof. The configuration and material of the opposite electrode 230 are not limited to the above and may be variously modified.

Figure 2:
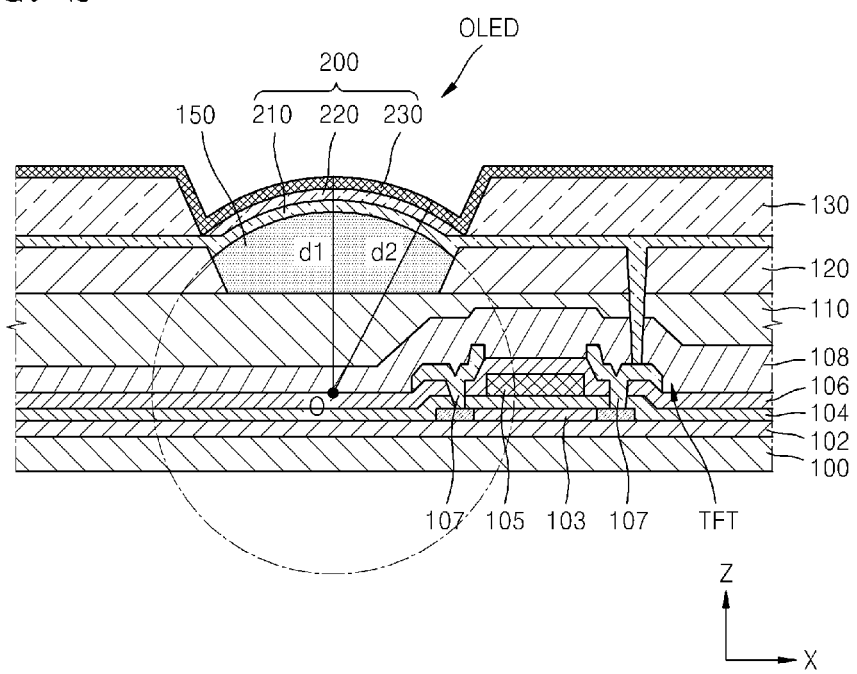
FIG. 2 is a schematic cross-sectional view illustrating the OLED display of FIG. 1.
Figure 3:
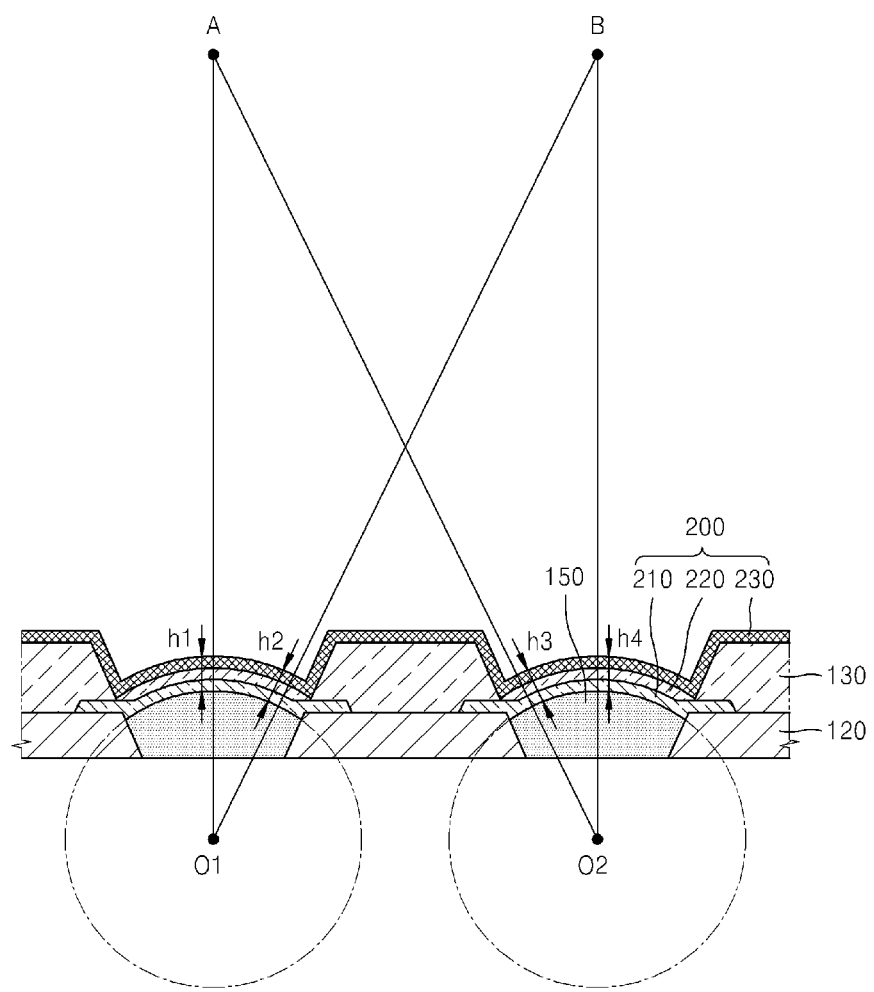
FIG. 3 is a schematic cross-sectional view illustrating the OLED display of FIG. 1.

FIGS. 2 to 3 are cross-sectional views illustrating the OLED display.

Referring to FIG. 2, as described above, the third insulating layer 150 has a cross section on the x-z plane having a substantially semi-circular shape. Accordingly, a cross section of the OLED 200 formed above the third insulating layer 150, on the x-z plane, also has a substantially semi-circular shape.

The distance from the center of curvature O of the cross section of the third insulating layer 150 to the top surface of the opposite electrode 230 of the OLED 200 is substantially uniform. As shown in FIG. 2, a distance d1 is defined extending in the z direction from the center of curvature O of the cross section of the third insulating layer 150 to the top surface of the opposite electrode 230. A distance d2 is defined extending with an angle from the z direction from the center of curvature O of the cross section of the third insulating layer 150 to the top surface of the opposite electrode 230. The distances d1 and d2 are substantially the same.

In other words, since the distance from the center of curvature O of the cross section of the third insulating layer 150 to the top surface of the third insulating layer 150 corresponds to the radius of the circle defined by the third insulating layer 150, the distance is substantially the same to every point on the surface of the third insulating layer 150. Thus, distances from the top surface of the third insulating layer 150 to the top surface of the opposite electrode 230 in any direction originating from the center of curvature are substantially the same.

As described above, the distances d1 and d2 as defined above are substantially the same. Thus, the optical paths of the OLED 200 originate from the center of curvature O and are substantially uniform.

The standard OLED is formed on a planarization layer which planarizes the top surface of a TFT, and thus, the standard OLED has a flat shape. This makes the optical paths of the standard OLED vary based on the viewing angle of the viewer with respect to a viewing angle in the z direction.

Consequently, in the standard OLED display, light emitted from different points has a difference in the optical path traveled, causing a change in wavelength of the emitted light. When the wavelength of light emitted in the z direction is about $\lambda$, the wavelength of light emitted from a viewing angle $\theta$ from the z direction is about $\lambda \cos\theta$. Accordingly, the brightness of light emitted at an angle with respect to the z direction is less than that of light emitted in the z direction. This causes chromatic aberrations in the display.

According to the embodiment of FIGS. 1 and 2, since the distance d1 extended in the z direction from the center of curvature O of the cross section of the third insulating layer 150 to the top surface of the opposite electrode 230 and the distance d2 extended at an angle from the z direction from the center of curvature O to the top surface of the opposite electrode 230 are substantially the same, the optical path of the OLED 200 is substantially uniform regardless of the viewing angle. Accordingly, since light is emitted in an axial direction at the center of curvature O, chromatic aberrations can be reduced regardless of the viewing angle.

The third insulating layer 150 has a substantially cylindrical shape in a three-dimensional view such that the cross section of the third insulating layer 150 has a substantially semi-circular shape.

In detail, the substrate 100 may have a major axis in an x-axis direction and a minor in a y-axis direction which perpendicularly cross each other. In some embodiment, the major axis is in the length of the substrate (x direction) and the minor axis is in the height of the substrate (y direction). The third insulating layer 150 has a substantially cylindrical shape in the minor axis, that is, the y-axis direction. Thus, when the OLED display vertically stands from the ground, respective subpixels may have a substantially cylindrical shape vertically extended from the ground.

As shown in FIG. 2, when the third insulating layer 150 has a substantially cylindrical shape, the distance from the center of curvature O of the third insulating layer 150 to the top surface of the opposite electrode 230 is substantially uniform.

As described above, when the third insulating layer 150 has a substantially cylindrical shape and it is assumed that the center of curvature O is located on an x-y plane, the distance from the center of curvature O to the top surface of the opposite electrode 230 on the same x-y plane is substantially uniform regardless of the viewing angle.

In general, the horizontal length of large OLED displays is longer than the vertical length. Typical viewing angles from right and left are greater than viewing angles from up and down. Thus, chromatic aberration or mura phenomenon can be perceived from the right or left viewing angles. Accordingly, when applying an embodiment to a large OLED display, the distance from the center of curvature O to the top surface of the opposite electrode 230 on the same x-y plane is substantially uniformed regardless of the viewing angle. Consequently, chromatic and brightness aberration generated based on viewing angle from left and right are substantially reduced.

According to some embodiments, the third insulating layer 150 has a substantially spherical shape. As shown in FIG. 2, when the third insulating layer 150 has a substantially spherical shape, the distance from the center of curvature O of the cross section of the third insulating layer 150 to the top surface of the opposite electrode 230 is substantially uniform.

When the third insulating layer 150 has a substantially spherical shape, the distance from the center of curvature O to the top surface of the opposite electrode 230 seen by the viewer an any viewing angle is substantially uniform. Accordingly, although the OLED display is seen from at any viewing angle such as top and bottom and left and right, the optical path originates from the center of curvature, thereby notably reducing chromatic and brightness aberration based on the viewing angle.

On the other hand, in FIG. 2, the center of curvature O of the cross section of the third insulating layer 150 is located between the interlayer insulating layer 106 and the first insulating layer 108. However, the center of curvature O is not limited thereto and can be place in another location as the curvature of the circle varies. That is, the center of curvature O of the circle may move according to the curvature of the circle corresponding to the cross section of the third insulating layer 150 and may be located in any part of the display above the substrate 100 as shown in FIG. 2 or may be located outside the substrate 100, and thus, may be variously changed.

FIG. 3 is a schematic view illustrating a cross section of the OLED display of FIG. 1, in which a change in viewing angle according to a location of a viewer is illustrated.

When a viewer at an A point sees a plurality of subpixels, a distance h1 in the OLED 200 originating from the center of curvature O1 of a subpixel opposite the A point is substantially the same as a distance h3 in the OLED 200 originating from the center of curvature O2 of a subpixel located at an angle from the A point. Also, when a viewer at a B point sees a plurality of subpixels, a distance h4 in the OLED 200 originating from the center of curvature center O2 of the subpixel opposite the B point is substantially the same as a distance h2 in the OLED 200 originating from the center of curvature O1 of the subpixel at an angle from the B point.

As described above, the standard OLED has a flat surface since it is formed on a planarized surface. This makes optical paths originating from the OLED in direct sight of a viewer and those where the viewer is at a viewing angle from the OLED differ from each other. Thus, in the standard OLED, there is a difference in wavelengths of light caused by optical path differences of light depending on the location of the standard OLED with respect to the viewer. When the wavelength of light vertically emitted is about $\lambda$, the wavelength of light emitted from a viewing angle $\theta$ is about $\lambda \cos\theta$. Accordingly, the brightness of light emitted at an angle is less than that of the light emitted perpendicular to the OLED. This causes chromatic and brightness aberrations in the standard display according to a viewing angle.

However, according to at least one embodiment, the OLED 200 is formed above the third insulating layer 150 having a semi-circular cross sectional shape. Accordingly, since the distance from the center of curvature O of the circle is substantially uniform at any viewing angle, the distance of emitting light from the center of curvature O is substantially identical, thereby emitting light having substantially identical properties with no chromatic aberration at various viewing angles.

In other words, since the optical paths of light originating from a plurality of respective subpixels seen from any position are substantially identical, there is no difference in optical path between the subpixels. Thus, light emitted to the viewer from the OLED 200 has substantially consistent color and brightness, thereby reducing the chromatic and brightness aberration.

FIGS. 4 to 7 are cross-sectional views illustrating a method of manufacturing the OLED display of FIG. 1.

Figure 4:
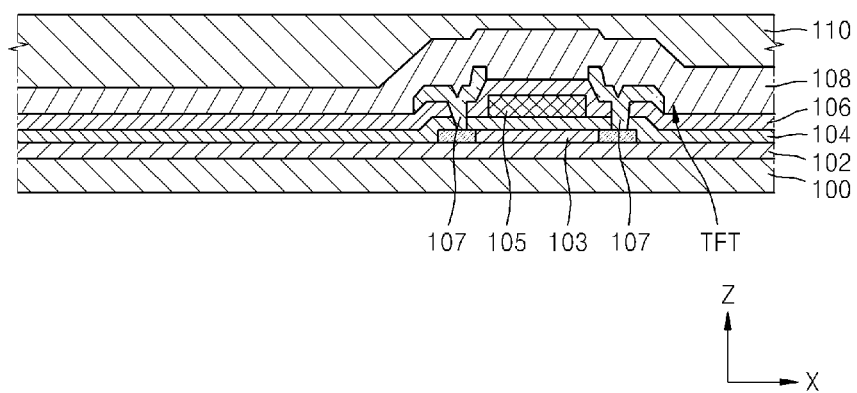
FIGS. 4 to 7 are cross-sectional views illustrating a method of manufacturing the OLED display of FIG. 1.

Referring to FIG. 4, the substrate 100 is prepared and then the TFT is formed above the substrate 100. The protection layer and the planarization layer are further formed above the TFT.

The substrate 100 may be formed of glass, metal, and/or plastic. The TFT formed above the substrate 100 includes the semiconductor layer 103 including amorphous silicon, polycrystalline silicon, or an organic semiconductor material, the gate electrode 105, and the source and drain electrodes 107.

In forming the TFT, the buffer layer 102 is formed to planarize the surface of the substrate 100 and to substantially prevent impurities from penetrating into the semiconductor layer 103. The semiconductor layer 103 is formed on the buffer layer 102.

The gate electrode 105 is formed above the semiconductor layer 103. The source and drain electrodes 107 are electrically connected when a signal is applied to the gate electrode 105.

In order to provide insulation between the semiconductor layer 103 and the gate electrode 105, the gate insulating layer 104 is formed interposed between the semiconductor layer 103 and the gate electrode 105.

The interlayer insulating layer 106 is formed above the gate electrode 105, and the source and drain electrodes 107 are formed above the interlayer insulating layer 106. The source and drain electrodes 107 are electrically respectively connected to the semiconductor layer 103 via contact holes formed in the interlayer insulating layer 106 and the gate insulating layer 104.

The first insulating layer 108 covering the TFT as a protection layer for protecting the TFT having the structure described is formed over the TFT. The first insulating layer 108 is shown as a single layer in FIG. 4 but may be variously modified such as having a multilayer structure.

Also, after forming the first insulating layer 108, the second insulating layer 110 is formed on the first insulating layer 108. The second insulating layer 110 may be a planarization layer or another protection layer. As shown in FIG. 4, when the OLED 200 is formed above the TFT, the second insulating layer 110 is formed as a planarization layer for planarizing the top surface of the first insulating layer 108 covering the TFT. Further, as shown in FIG. 4, the gate insulating layer 104, the interlayer insulating layer 106, the first insulating layer 108, and the second insulating layer 110 are formed above the entire surface of the substrate 100.

Figure 5:
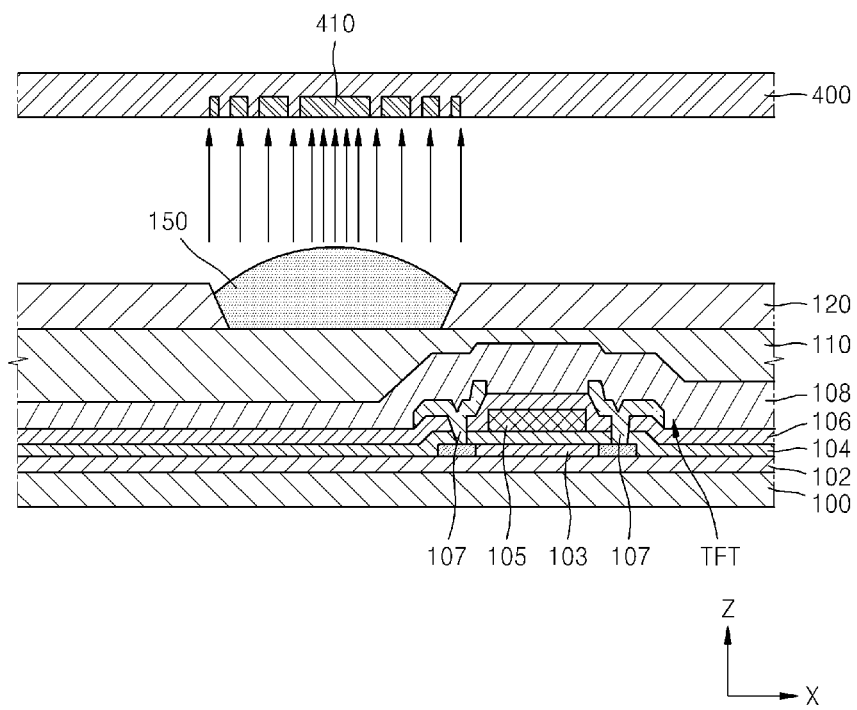

After that, referring to FIG. 5, the first pixel defining layer 120 is formed above the second insulating layer 110. The first pixel defining layer 120 has an opening, and the third insulating layer 150 is formed in the opening of the first pixel defining layer 120.

The first pixel defining layer 120 may be formed using a photolithography process of applying PR on the second insulating layer 110 and etching PR of a part corresponding to the opening. The method of forming the first pixel defining layer 120 is not limited thereto and the first pixel defining layer 120 may be formed using general and various processes. The first pixel defining layer 120 has the opening, which defines a region in which the third insulating layer 150 is formed.

As described above, the third insulating layer 150 is formed in the opening defined in the first pixel defining layer 120. Referring to FIG. 5, the third insulating layer 150 is formed to such that a curvature radius at the top surface thereof is substantially uniform. In other words, a cross section of the third insulating layer 150 is formed to have a semi-circular shape with a substantially uniform radius of curvature.

In some embodiments, the third insulating layer 150 is formed by applying a material for the third insulating layer 150 on the second insulating layer 110 exposed by the opening in the first pixel defining layer 120 using a solution process using ink-jet printing or nozzle printing. After that, as shown in FIG. 5, the third insulating layer 150 is dried by a dryer 400 to form a substantially uniform radius of curvature of the top surface. A low pressure dryer (LPD) may be used as the dryer 400 to dry the third insulating layer 150.

A part of the LPD may be modified and used in manufacturing the OLED display. A general LPD uniformly dries a material forming the intermediate layer 220, etc. by using a substantially uniform exhaust rate throughout the entire surface of the LPD.

However, according to the embodiment of FIG. 5, a dryer 400 having an exhaust rate that is higher at a central portion of the third insulating layer 150 than at an edge of the third insulating layer 150 is used in drying the third insulating layer 150.

As shown in FIG. 5, the dryer 400 includes a plurality of exhaust slits (or holes) 410 formed at different intervals. That is, the exhaust slits 410 formed above the third insulating layer 150 are larger at the central portion of the third insulating layer 150 and gradually decrease in size toward the edge thereof. When using the dryer 400, since the exhaust rate of the central portion is higher while drying the material forming the third insulating layer 150, the material forming the third insulating layer 150 is collected toward the central portion of the third insulating layer 150, thereby forming the central portion of the third insulating layer 150 to be convex.

As described above, the curvature radius of the top surface of the third insulating layer 150 is formed to be substantially uniform using the dryer 400. In some embodiments, the shape of the third insulating layer 150 is substantially cylindrical based on the configuration of the dryer. In other embodiments, the third insulating layer 150 has a substantially spherical shape.

Figure 6:
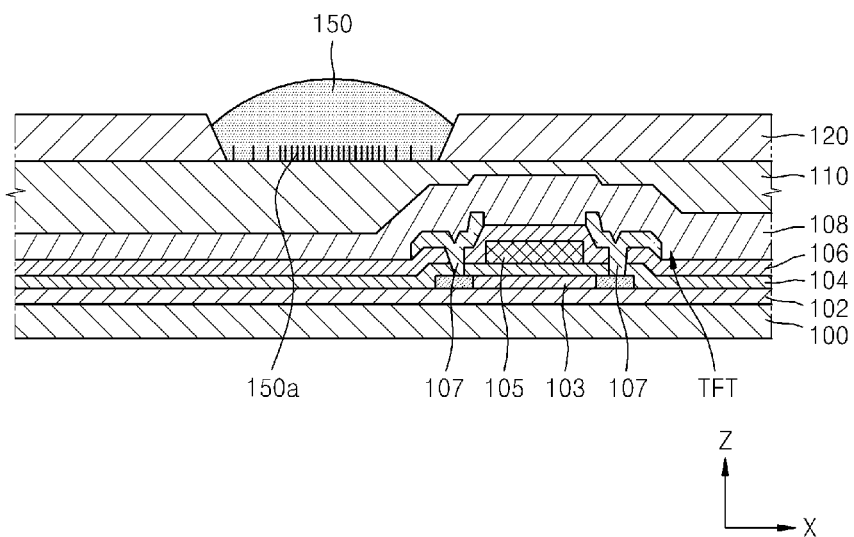

In contrast to the method shown in FIG. 5, the third insulating layer 150 may be formed using the method shown in FIG. 6.

Referring to FIG. 6, the forming of the third insulating layer 150 includes performing a surface treatment on an inner surface of an opening in which the third insulating layer 150 is formed and applying a material for an insulating layer onto the surface-treated inner surface by using a solution process. After that, the material for the insulating layer is dried.

In greater detail, the surface treatment may be performed in such a way that a hydrophilic property or a hydrophobic property is different in a central portion and an edge of the second insulating layer 110 formed underneath the third insulating layer 150 in the opening defined in the first pixel defining layer 120. As shown in FIG. 6, the surface treatment is performed by applying a hydrophilic material 105a onto the top surface of the second insulating layer 110 exposed by the opening in the first pixel defining layer 120. The hydrophilic material 150a may be applied at a greater concentration at the central portion of the top surface of the second insulating layer 110 exposed by the opening in the first pixel defining layer 120 and the concentration of the hydrophilic material 150a is reduced toward the edge of the opening.

A selective surface treatment as described above may be performed using a photolithography process. The selective surface treatment is not limited thereto but may be performed using various processes.

In FIG. 6, the selective surface treatment is illustrated as being performed using the hydrophilic material 150a. However, the selective surface treatment may be performed using a hydrophobic material (not shown). In these embodiments, the hydrophobic material is applied with a greater concentration at the edge of the top surface of the second insulating layer 110 exposed by the opening in the first pixel defining layer 120 and the concentration of the hydrophobic material is reduced toward the central portion.

After performing the selective surface treatment, a material for forming the third insulating layer 150 is applied onto the second insulating layer 110 exposed by the opening in the first pixel defining layer 120 by using a solution process of inkjet printing or nozzle printing. Since the hydrophilic material 150a is concentrated on the central portion of the second insulating layer 110 exposed by the opening in the first pixel defining layer 120, the material for forming the third insulating layer 150 converges on the central portion, thereby forming the third insulating layer 150 with a substantially uniform curvature radius at a top surface thereof.

After applying the material forming the third insulating layer 150 inside the opening of the selectively surface-treated first pixel defining layer 120, the material forming the third insulating layer 150 is dried. As described above, since the material forming the third insulating layer 150 is applied onto the second insulating layer 110 exposed by the opening in the first pixel defining layer 120 after the selective surface treatment, the material for forming the third insulating layer 150 is applied to form the curvature radius of the top surface of the third insulating layer 150 to be substantially uniform, thereby drying the material for forming the third insulating layer 150 as it is.

According to a method of surface-treating the top surface of the second insulating layer 110 exposed by the opening in the first pixel defining layer 120, the curvature radius of the top surface of the third insulating layer 150 may be formed to be substantially uniform. In this embodiment, the third insulating layer 150 has a substantially cylindrical shape. In other embodiments, the third insulating layer 150 has a substantially spherical shape.

Figure 7:
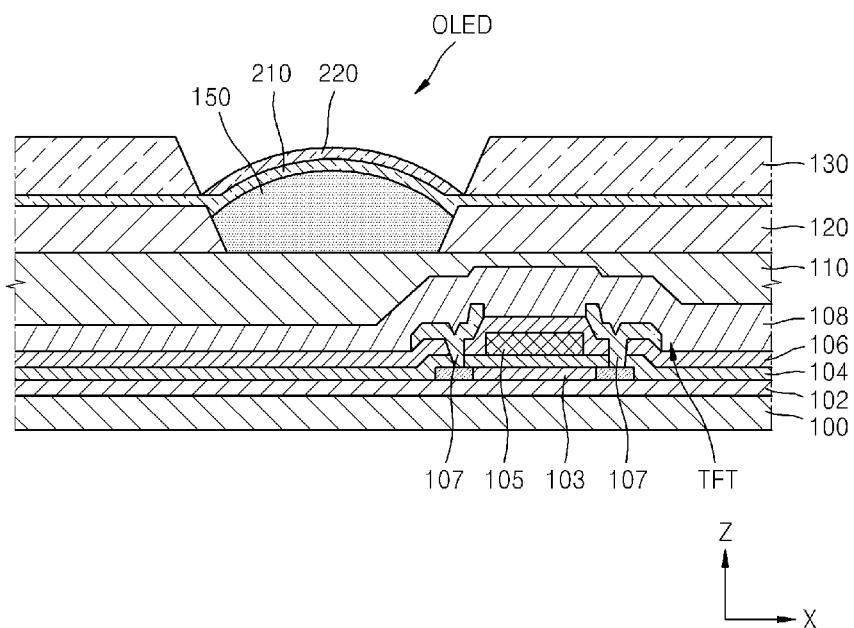

Referring to FIG. 7, after forming the third insulating layer 150 using one of the methods shown in FIGS. 5 and 6, the OLED 200 is formed above the third insulating layer 150.

In detail, after forming the third insulating layer 150, the pixel electrode 210 is formed on the third insulating layer 150 to cover the third insulating layer 150 while covering a part of the first pixel defining layer 120. The pixel electrode 210 may be formed as one of a semitransparent electrode and a reflective electrode. However, the pixel electrode 210 may be formed of various materials as described above and may have a structure variously modifiable such as a single layer or a multilayer.

After forming the pixel electrode 210, the second pixel defining layer 130 may be formed above the first pixel defining layer 120. The second pixel defining layer 130 may be formed to cover an edge of the pixel electrode 210. In FIG. 7, it is shown that the pixel electrode 210 is formed above an entire top surface of the first pixel defining layer 120. However, the pixel electrode 210 may be formed to cover the third insulating layer 150 and to extend to cover a part of the first pixel defining layer 120. Accordingly, the second pixel defining layer 130 formed above the first pixel defining layer 120 may be formed to cover a part of the edge of the pixel electrode 210.

The second pixel defining layer 130 formed above the first pixel defining layer 120 defines a pixel by having openings corresponding to respective subpixels, that is, openings covering the edge and exposing a central portion of the pixel electrode 210. Also, the second pixel defining layer 130 separates an end of the pixel electrode 210 from the opposite electrode 230 above the pixel electrode 210, thereby preventing arcs from occurring at the end of the pixel electrode 210.

The intermediate layer 220 including an EML may be formed in a pixel region defined by the opening in the second pixel defining layer 130. The intermediate layer 220 of the OLED 200 may include a low-molecular substance or a high-molecular substance. After that, the opposite electrode 230 covering the intermediate layer 220 including the EML and opposite to the pixel electrode 210 is formed above the entire surface of the substrate 100. The opposite electrode 230 may be formed as one of a semitransparent electrode and a reflective electrode. The opposite electrode 230 may be formed of various materials as described above. The configuration and material of the opposite electrode 230 are not limited thereto and may be variously modified.

The OLED 200 formed above the third insulating layer 150 also has a substantially semi-circular shape. That is, the distance between the center of curvature O of the third insulating layer 150 and the top surface of the opposite electrode 230 of the OLED 200 is substantially uniform. Accordingly, since the distance to the center of curvature O of is substantially uniform at any viewing angle, the distance of emitting light from the center of curvature O is substantially the same, thereby emitting same light with no chromatic or brightness aberration at various viewing angles.

In other words, since the optical paths of a plurality of respective subpixels seen from a certain position are substantially identical, an optical path difference does not occur between subpixels. Thus, light is emitted to the viewer by the OLED 200 having substantially the same color and brightness, thereby notably reducing the chromatic and brightness aberration.

While one or more embodiments of the described technology have been described with reference to the figures, it will be understood by those of ordinary skill in the art that various changes in form and detail may be made therein without departing from the spirit and scope of the described technology as defined by the following claims.

As described above, according to at least one embodiment, there is provided an OLED display capable of reducing chromatic and brightness aberration according to a viewing angle and a method of manufacturing the OLED display.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the described technology have been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display, comprising:
  a substrate;
  a thin film transistor (TFT) formed over the substrate;
  a first pixel defining layer formed over the TFT and having an opening;
  an insulating layer formed in the opening and including a top surface having a dome shape, the dome shape having a substantially uniform radius of curvature; and
  an OLED including a pixel electrode in direct electrical connection with the TFT, wherein the pixel electrode is formed over the insulating layer.

2. The OLED display of claim 1, wherein the insulating layer has a substantially cylindrical shape.

3. The OLED display of claim 2, wherein the OLED display has a length extending in a first direction and a height extending in a second direction crossing the first direction and wherein the cylindrical shape of the insulating layer extends along the second direction.

4. The OLED display of claim 1, wherein the insulating layer has a substantially spherical shape.

5. The OLED display of claim 1, wherein the pixel electrode is electrically connected to the TFT and wherein the OLED further comprises:
  an intermediate layer formed over the pixel electrode and comprising an emission layer; and
  an opposite electrode formed over the intermediate layer,
  wherein the top surface of the insulating layer has a center of curvature, and
  wherein the distances from any point on the top surface of the insulating layer to the center of curvature are substantially the same.

6. The OLED display of claim 5, wherein the pixel electrode comprises an end formed over the first pixel defining layer and wherein the OLED display further comprises a second pixel defining layer formed over the first pixel defining layer to cover the end of the pixel electrode.

7. An organic light-emitting diode (OLED) display, comprising:
  a substrate;
  a plurality of pixels formed over the substrate, wherein each pixel comprises:
    a thin film transistor (TFT);
    a pixel defining layer formed over the TFT, wherein an opening is defined in the pixel defining layer;
    an insulating layer formed in the opening and including a top surface, wherein the top surface has a dome shape having a substantially uniform radius of curvature; and
    an OLED formed over the insulating layer and electrically connected to the TFT.

8. The OLED display of claim 7, wherein sides of the insulating layer contact sides of the opening and wherein the height of the sides of the insulating layer is less than that of the sides of the opening.

9. The OLED display of claim 7, wherein the dome shape of the top surface of the insulating layer has a center of curvature and wherein the OLED has a center of curvature that is substantially the same as that of the insulating layer.

10. The OLED display of claim 7, wherein the insulating layer has a substantially cylindrical or spherical shape.

11. The OLED display of claim 7, wherein the insulating layer has first and second thicknesses, wherein the first thickness is greater than the thickness of the pixel defining layer, and wherein the second thickness is less than the thickness of the pixel defining layer.

12. The OLED display of claim 11, wherein the first thickness is the maximum thickness of the insulating layer and wherein the second thickness is the minimum thickness of the insulating layer.

13. The OLED display of claim 1, wherein the insulating layer has a center of curvature and wherein the OLED is configured to emit light having optical paths that originate from the center of curvature of the insulating layer.

14. The OLED display of claim 1, wherein the OLED has a substantially uniform thickness.

\* \* \* \* \*